United States Patent

Beale

[11] Patent Number: 5,157,438
[45] Date of Patent: Oct. 20, 1992

[54] WORKPIECE SUPPORT AND CLAMPING MEANS

[75] Inventor: Stephen J. Beale, Weymouth, England

[73] Assignee: DEK Printing Machines Limited, Weymouth, United Kingdom

[21] Appl. No.: 830,613

[22] Filed: Feb. 4, 1992

[51] Int. Cl.⁵ .............................................. G03B 27/58
[52] U.S. Cl. ........................................ 355/72; 355/53
[58] Field of Search ................ 355/72, 73, 53; 269/53, 269/54

[56] References Cited

U.S. PATENT DOCUMENTS

| | | | |
|---|---|---|---|
| 3,670,394 | 6/1972 | Daniels et al. | 269/53 X |
| 4,278,348 | 7/1981 | Funk et al. | 355/73 |
| 4,666,291 | 5/1987 | Taniguchi et al. | 355/53 X |
| 4,788,577 | 11/1988 | Akiyama et al. | 355/53 |

Primary Examiner—Richard A. Wintercorn
Attorney, Agent, or Firm—Fay, Sharpe, Beall, Fagan, Minnich & McKee

[57] ABSTRACT

Support means for a workpiece, such as for example a printed circuit board to be screen printed, comprise a plurality of parallel upright elongate members, upper ends of which engage the underside of the workpiece or components secured thereon. Armatures and electromagneto magnets are provided in a housing selectively to clamp the elongate members in a raised position or allow them to fall to a lowered position.

Clamping means to clamp the workpiece comprise clamping plates on opposite sides of the workpiece and having very thin foils projecting laterally therefrom over the workpiece and operating means to lower or raise the clamping plates to clamp or release the workpiece.

8 Claims, 5 Drawing Sheets

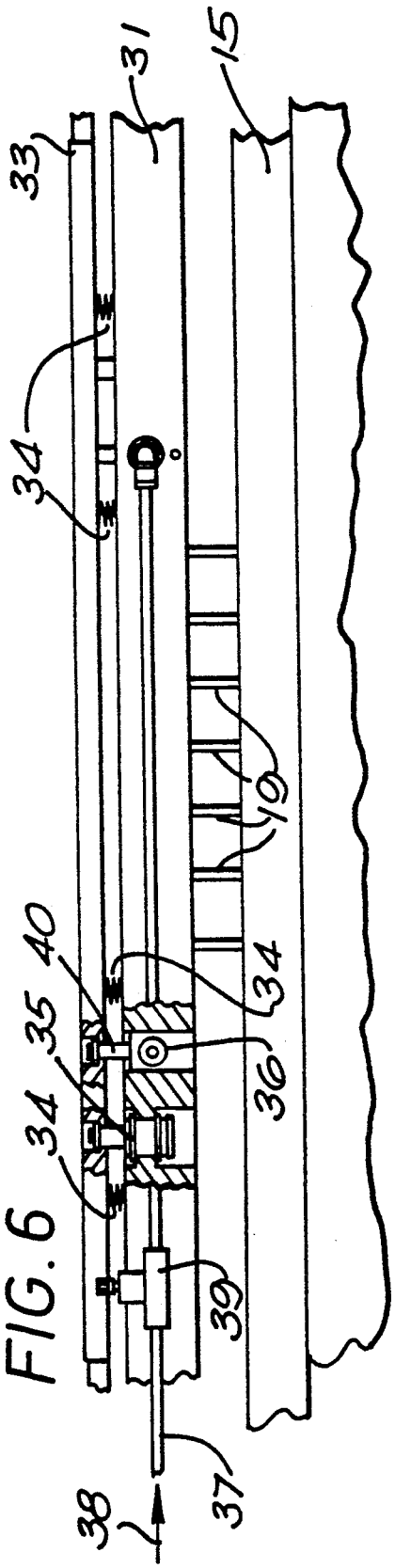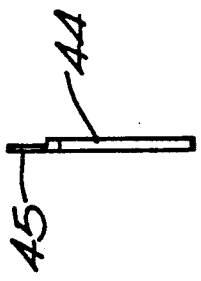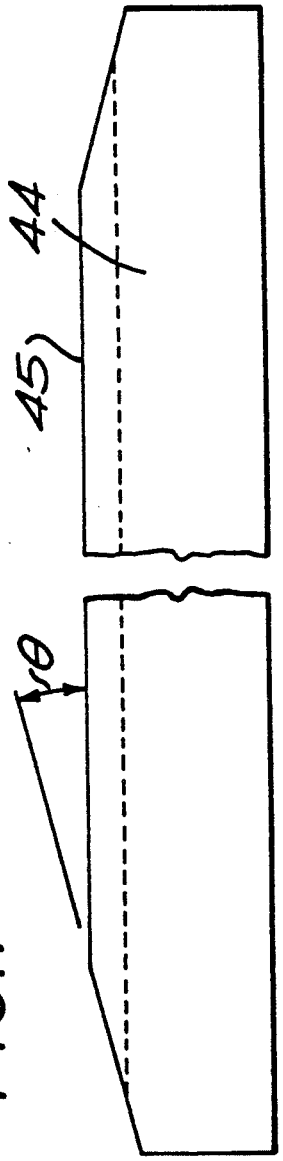

WORKPIECE SUPPORT AND CLAMPING MEANS

FIELD OF THE INVENTION

The present invention relates to workpiece support and clamping means.

BACKGROUND OF THE INVENTION

It is frequently necessary to locate and support a workpiece in a determined position and orientation so that an operation can be effected thereon, particularly an operation which applies pressure to the workpiece, which pressure must be absorbed and resisted by the workpiece support means without causing damage to the workpiece. It may well be necessary to support the workpiece at several locations to prevent it distorting under the force applied to it by the operation.

The invention has particular although not exclusive application to support means for printed circuit boards to form electronic circuits during a printing operation thereon, which circuit boards may already include, on a face thereof opposite to the face which is to be printed, circuit components which project from the face of the board.

Since the board may be of considerable size, for example 500 mm square and relatively thin, It cannot be supported merely by its edges on spaced supports of a conveyor, but must be supported, when at a printing position, by support means applied to the underside of the board or to projections on the underside of the board at positions intermediate the edges. Forming a shaped support member to support the board at determined positions and at determined heights at such positions can be a very time consuming operation which is very uneconomic when there is only to be a short print run.

It is also desirable to provide means to secure a board in position against upward movement. Vacuum suction has been proposed but is unsatisfactory particularly when the underside of the board to which vacuum means must be applied is not smooth, for example it may have components thereon, or if the board includes through holes such as those intended to receive wires to connect components.

SUMMARY OF THE INVENTION

The invention provides workpiece support means, to support a face of a workpiece during an operation in which a force is applied to another face of the workpiece, comprising a support surface, an array of elongate members each extending through the support surface, a respective end surface on each of the elongate members, clamping means supported on the support surface and provided one on each of the elongate members, and holding means to act upon the clamping means selectively to cause them to hold the respective elongate member in a raised position whereby the elongate members are supported against axial movement with respect to the support surface and said end surfaces of said elongate members in a raised position and provide support for the workpiece.

The elongate members could for example be 200 in number provided in a regular grid formation to provide a support area variable in size but having a maximum size approximately 18 inches square.

The clamping means preferably comprise electro-magnets to act upon the elongate members and the holding means comprise means selectively to supply electric current to the electro-magnets.

Advantageously each of the elongate members has an armature plate at the end thereof remote from said one end, the electromagnets comprise annular collars secured to the support surface and the elongate members extend through the annular collars.

Biassing means may be provided to raise the armature plates of the elongate members into close proximity with the annular collars and may comprise a lifting plate provided beneath the armatures of a plurality of the elongate members and means to raise the lifting plate.

The invention can further provide workpiece clamping means to clamp a workpiece on a conveyor while a screen printing operation is effected on a face of the workpiece, the clamping means comprising a pair of plates located at opposite sides of the workpiece, thin foils projecting laterally from the plates to overlie edge portions of said face of the workpiece and operating means to raise and lower the pair of plates selectively to cause the thin foils to apply a clamping force to the workpiece.

Thus a screen through which printing is effected can overlie the plates during the printing operation without the screen being damaged by a squeegee pressing it against the plates and the workpiece.

Preferably the thin foils have angled end portions and are secured by adhesive to the pair of plates which are raised and lowered by the operating means.

BRIEF DESCRIPTION OF THE DRAWINGS

FIG. 6 is a partly sectioned view taken in the direction of arrow VI of FIG. 3;

FIG. 7 shows a plan view of a clamping plate of the clamping means of FIGS. 3 to 6; and FIG. 8 is an end view corresponding to FIG. 7.

DETAILED DESCRIPTION OF THE PREFERRED EMBODIMENT

Figure 3:
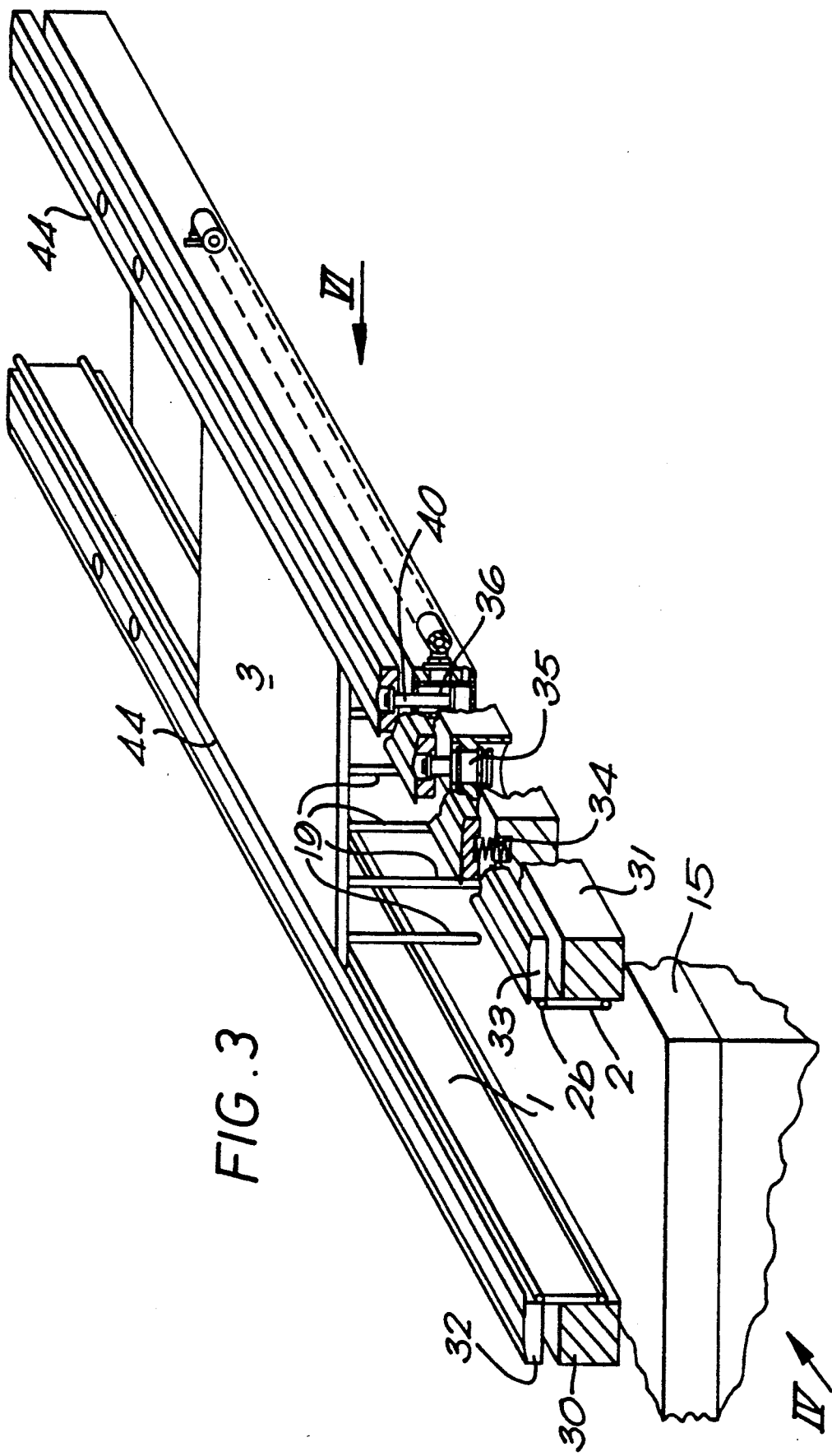
FIG. 3 is a partly sectioned perspective view of workpiece clamping means according to the invention.
Figure 4:
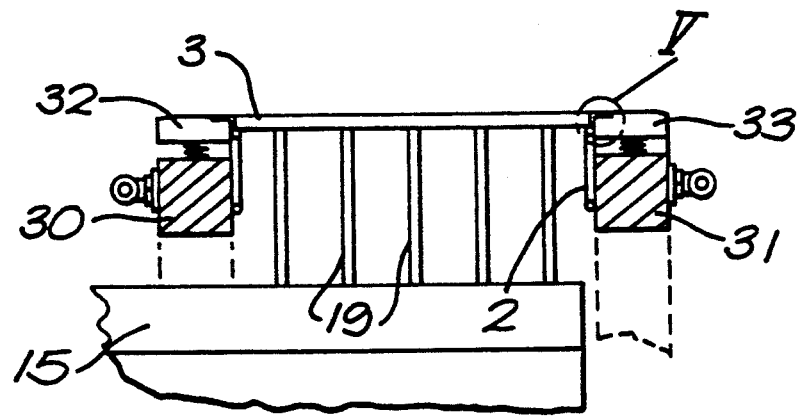
FIG. 4 is a view taken on arrow IV of FIG. 3.

Referring to the drawings and firstly to FIGS. 3 and 4, a support surface 15 is provided as a perforated plate forming the lid of a housing 14 having a lower wall 16 a peripheral wall 17 and intermediate walls 18, the intermediate walls 18 dividing the housing into four compartments. In each of two of the compartments forty-nine elongate members 19 are provided in a seven by seven array and in each of the other two of the compartments fifty-six elongate members are provided in a seven by eight array. Each elongate member 19 has at the lower end thereof an armature plate 20 of magnetic material. For each elongate member 19a a respective electro-magnet 21 of annular form is provided secured beneath the perforated support plate 15 with the central bore in the annular magnet 21 aligned with the respective perforation in the support plate 15. A printed circuit board 22 is secured on the underside of the perforated plate 15 and the electro-magnets 21 are mounted on the printed circuit board 22 and are electrically connected thereto so that by means of the printed circuit board they can be supplied with energising current.

Figure 1:
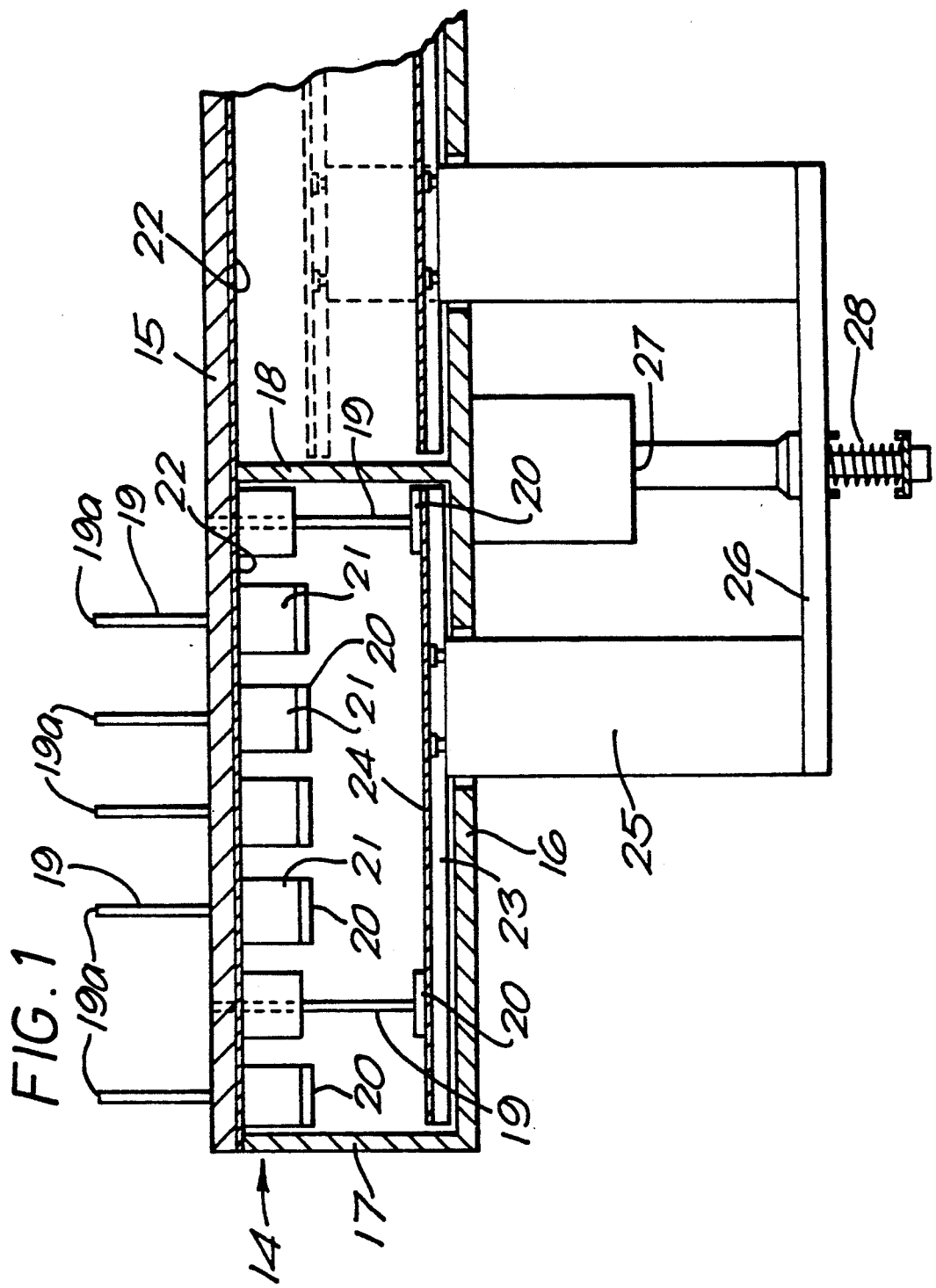
FIG. 1 is a partly sectioned elevation through an embodiment of workpiece support means according to the invention.

In the bottom of each of the four compartments a respective lifting plate 23 is provided with a weakly-magnetic mat 24 on its upper face. Each lifting plate 23 is connected by a respective lifting column 25 to a main lifting plate 26 which is raisable and lowerable by means of a piston cylinder arrangement 27 with an over stroke compensator in the form of spring cushion means 28. Bearing means (not shown) are provided for the columns 25 to restrain them for vertical movement only. Thus by means of the piston cylinder arrangement 27, the lifting plates 23 can be moved between the lowered position shown in full lines in FIG. 1 and the raised position shown in dotted lines at the right hand side of FIG. 1. In the raised position of the lifting plates 23 the armature plates 20 of all forty-nine or fifty-six of the elongate members 19 located thereabove are raised so that the armature plates 20 are in abutment with the undersides of the respective electro-magnets 21 through which they project. If the electro-magnets 21 are then selectively energized by way of the printed circuit boards 22, the armature plates 20 of the energised magnets will be attracted to the magnets 21 and will support the respective elongate member 19 in a raised position. Upon lowering of the lifting plates 23 by expanding the piston cylinder arrangement 27, those of the elongate members 19 corresponding to magnets 21 which are not energised will move downwardly with the lifting plate 23 (as shown at the right hand side of the left hand compartment in FIG. 1 and one in from the left hand side of the left hand compartment in FIG. 1) but all those of the elongate members 19 corresponding to energised magnets 21 will be retained in a raised position and the upper end surfaces 19a of those raised elongate members 19 will form a support for a workpiece. Thin annular washers (not shown) of non-magnetic material are advantageously provided on the upper surfaces of the armature plates 20 to form an air gap to prevent residual magnetism from retaining the armature plates 20 on the undersides on unenergised magnets 21.

Figure 2:
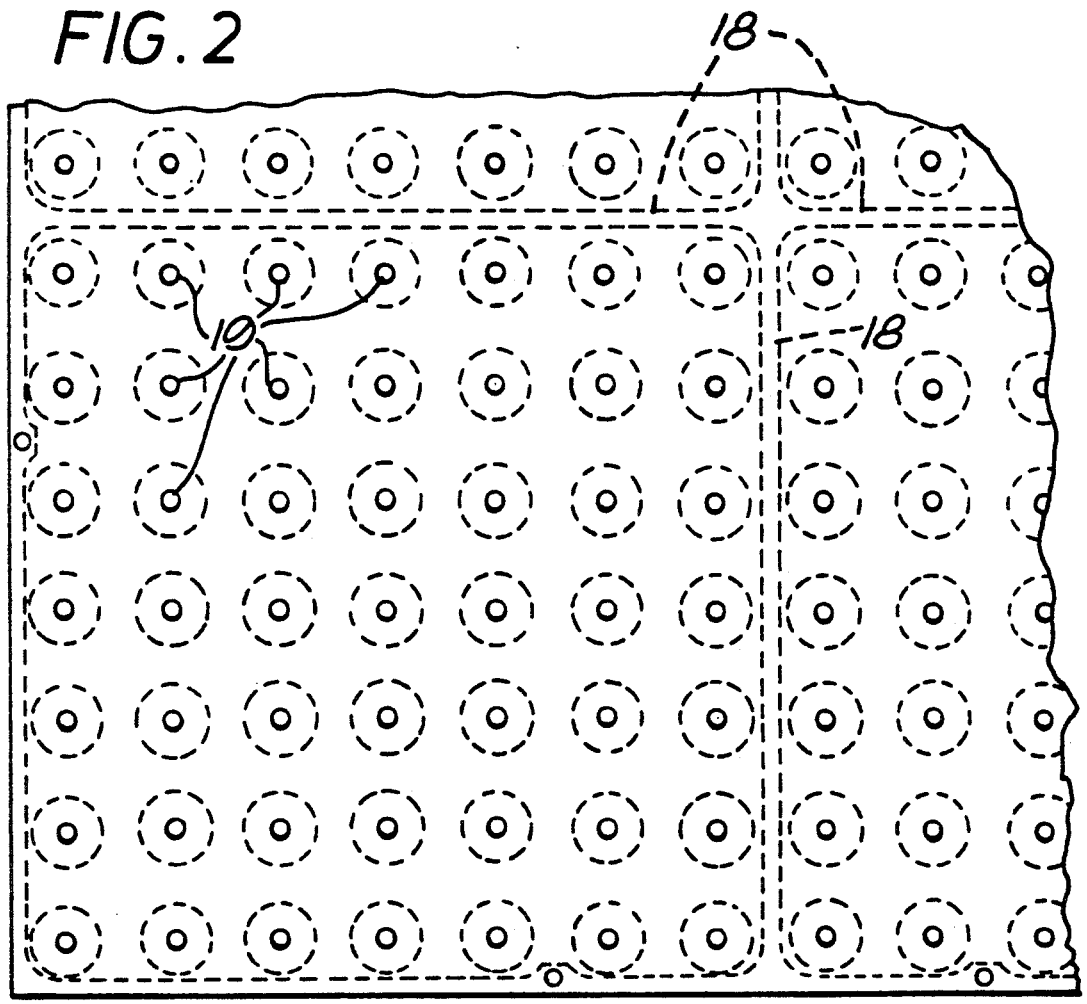
FIG. 2 is plan view corresponding to FIG. 1.
Figure 5:
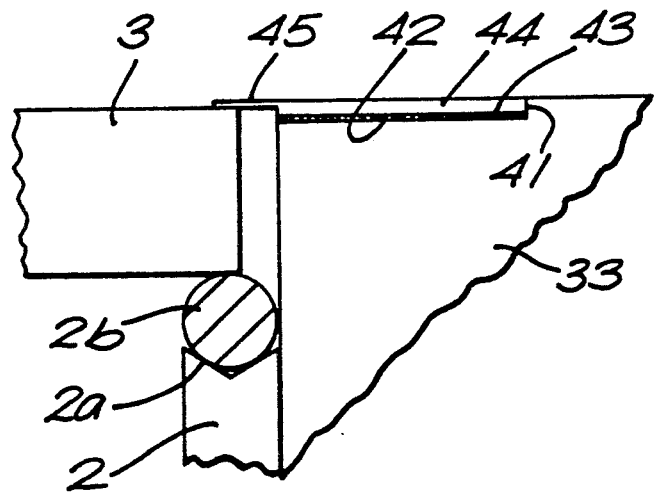
FIG. 5 is a greatly enlarged view of the portion indicated by the circle V of FIG. 4.

Referring to FIGS. 3 to 8, workpiece clamping means are provided to clamp a printed circuit board 3 during screen printing of the upper face thereof. The printed circuit board 3 is provided on spaced conveyor members 1 and 2 and, as can be seen in FIG. 5, the spaced conveyor member 2 comprises a fixed strip with a V-shaped groove 2a in its upper surface in which a conveyor band 2b moves longitudinally to convey the printed circuit board to a printing position and, after printing, from the printing position. FIGS. 3, 4 and 6 show that the printed circuit board 3 when at the printing position is supported by the upper ends of a plurality of elongate members, for example the elongate members 19 of FIGS. 1 and 2, projecting from a support 15.

The spaced conveyor members 1 and 2 are mounted on support strips 30 and 31 and respective upper strips 32 and 33 are mounted above the strips 30 and 31. At each end of each of the upper strips 32, 33, connecting means are provided to the respective underlying support strip 30, 31. Referring to FIG. 3 and considering the strips 31 and 33. It can be seen at the near end that the strips 31, 33 are coupled together by a compression coil spring 34, a linear bearing 35 and a piston and cylinder arrangement 36. The compression spring 34 biasses the upper strip 33 upwardly away from the support strip 31, the linear bearing 35 restrains upward and downward movement of the strip 33 With respect to the strip 31 to vertical movement and the piston cylinder arrangement 36 is supplied with compressed air through a pipe 37 as indicated by arrow 38 in FIG. 6 via a flow regulator 39. The piston cylinder arrangement 36 comprises a piston rod 40 secured at its upper end to the upper strip 33 and having a piston at its lower end engaged in a cylinder in the support strip 31, a port in the cylinder wall through which compressed air is supplied being provided above the piston thereby providing a single acting piston which can apply a downward force to move the upper strip 33 towards the strip 31 in opposition to the force of the compression coil springs 34.

As can be seen in FIG. 5, the upper face of the upper strip 33 is rebated at its inner edge to form a recess with a vertical face 41 and a horizontal face 42 Secured within the recess by adhesive 43 is a clamping plate 44 which is cantilevered out from the upper strip 33 and has a recess in its underside at its inner edge so to form an integral foil 45. Thus the foil 45 is provided at the ed&e of the upper strip 33 which is closest to the opposing upper strip 32 which has a respective clamping plate 44 with clamping foil 45 thereon. The clamping foils 45 overlie the edges of the printed circuit board 3 and apply a downward force thereto.

The clamping plate 44 with the clamping foil 45 is shown in FIGS. 7 and 8 and it can be seen that inner corners are cut away at an angle $\phi$ of for example 15 degrees. The plate 44 may for example be 500 mm in length, 0.5 mm in thickness and have an overall width of 10 mm, the foil 45 representing 2 mm of that width and the foil 45 having a thickness of 0.1 mm The angled corner portions extend for 10 mm of the length of the strip at each end.

It will be seen therefore that the step provided between the upper face of the clamping plate 44 and the upper face of the printed circuit board 3 being printed is only 0.1 mm high and thus the printing screen will not be damaged by extending over the step and having the squeegee passed thereover under pressure. The printed circuit board can however be reliably retained in position during the printing operation.

What is claimed is:

1. Workpiece support means, to support a face of a workpiece during an operation in which a force is applied to another face of the workpiece, said workpiece support means comprising a support surface, an array of elongate members each extending through said support surface, a respective end surface on each of said elongate members, clamping means supported by said support surface and provided one on each of said elongate members, and holding means to act upon said clamping means selectively to cause said clamping means to hold the respective elongate member in a raised position whereby said elongate members are supported against axial movement with respect to said support surface and said end surfaces of said elongate members are supported in a raised position and provide support for the workpiece.

2. Workpiece support means as claimed in claim 1, wherein said clamping means comprise electro-magnets to act upon said elongate members and said holding means comprise means selectively to supply electric current to said electro-magnets.

3. Workpiece support means as claimed in claim 2, including a respective armature plate on each of said elongate members at the end thereof remote from said one end and wherein said electromagnets comprise annular collars secured to said support surface and said elongate members extend through said annular collars.

4. Workpiece support means as claimed in claim 3, including biasing means to raise said armature plates of said elongate members into close proximity with said annular collars.

5. Workpiece support means as claimed in claim 4, wherein said biasing means comprise a lifting plate provided beneath said armatures of a plurality of said elongate members and means to raise said lifting plate.

6. Workpiece clamping means to clamp a workpiece on a conveyor while a screen printing operation is effected on a face of the workpiece, said clamping means comprising a pair of plates located at opposite sides of the workpiece, thin foils projecting laterally from said plates to overlie edge portions of said face of the workpiece and operating means to raise and lower said pair of plates selectively to cause said thin foils to apply a clamping force to the workpiece.

7. Workpiece clamping means as claimed in claim 6, wherein said thin foils have angled end portions and are secured by adhesive to said pair of plates which are raised and lowered by said operating means.

8. Workpiece clamping means as claimed in claim 6, wherein said operating means comprise downwardly acting air pistons to effect clamping and spring return means.

* * * * *